(12) United States Patent
Takigawa et al.

(10) Patent No.: US 6,579,428 B2
(45) Date of Patent: Jun. 17, 2003

(54) ARC EVAPORATOR, METHOD FOR DRIVING ARC EVAPORATOR, AND ION PLATING APPARATUS

(75) Inventors: Shirou Takigawa, Nishinomiya (JP); Kouichi Nose, Nishinomiya (JP); Yasuhiro Koizumi, Nishinomiya (JP); Takanobu Hori, Nishinomiya (JP); Yukio Miya, Kawagoe (JP)

(73) Assignees: Shinmaywa Industries, Ltd., Hyogo (JP); Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/963,763

(22) Filed: Sep. 26, 2001

(65) Prior Publication Data

US 2002/0046941 A1 Apr. 25, 2002

(30) Foreign Application Priority Data

Sep. 26, 2000 (JP) ............................. 2000-292563

(51) Int. Cl.⁷ .................... C23C 14/00; C23C 16/00
(52) U.S. Cl. ................ 204/192.38; 204/298.41; 118/723 R; 118/723 MP; 118/723 VE; 118/723 I; 118/719
(58) Field of Search ............... 204/192.38, 298.41; 118/723 R, 723 MP, 723 VE, 723 I, 719; 427/523, 580

(56) References Cited

U.S. PATENT DOCUMENTS

| | | | | |
|---|---|---|---|---|
| 3,887,778 A | * | 6/1975 | Farrall | 200/144 B |
| 4,915,977 A | * | 4/1990 | Okamoto et al. | 427/37 |
| 5,221,349 A | * | 6/1993 | Tamagaki | 118/708 |
| 5,427,843 A | * | 6/1995 | Miyajima et al. | 428/216 |
| 5,997,705 A | * | 12/1999 | Welty | 204/298.41 |

* cited by examiner

Primary Examiner—Steven H. VerSteeg
(74) Attorney, Agent, or Firm—Marshall, Gerstein & Borun

(57) ABSTRACT

An arc evaporator comprises: an anode; an evaporation source electrode as a cathode; and a current control unit for supplying an AC square wave arcing current across the anode and the evaporation source electrode.

22 Claims, 8 Drawing Sheets

| No. | wave form | reflectance [%] |
|---|---|---|
| 5 | | 70.4 |
| 6 | | 62.4 |
| 7 | | 47.7 |

Fig. 10

ARC EVAPORATOR, METHOD FOR DRIVING ARC EVAPORATOR, AND ION PLATING APPARATUS

BACKGROUND OF THE INVENTION

1. Field of the Invention

The present invention relates to an arc evaporator, a method for driving the arc evaporator, and an ion plating apparatus.

2. Description of the Related Art

A various types of evaporation sources are used in an ion plating apparatus. One of such evaporation sources is an arc evaporation source.

In the ion plating apparatus using the arc evaporation source, when the apparatus is activated, arcing is generated between a cathode as the arc evaporation source and an anode, a cathode material is melted and evaporated in an arc spot of the cathode, the evaporated cathode material is ionized by electrons traveling from the cathode toward the anode, and the ionized cathode material is attached onto and deposited on a surface of a substrate held by a substrate holder. Thus, a thin film made of the cathode material is formed on the surface of the substrate.

Ideally, in the ion plating apparatus, the cathode material in the form of atoms flies from the cathode and is attached onto the surface of the substrate. In this ideal plating state, the thin film formed on the substrate has a smooth surface. In the case of using a high melting point material such as titanium as the cathode material, the cathode material in the form of atoms flies, allowing a thin film to have a smooth surface.

On the other hand, in the case of using a low melting point material such as aluminum as the cathode material, a melted and liquid cathode material (macro particles) flies, causing a thin film to have a roughened surface.

As a solution to this, an arcing current of the arc evaporation source might be reduced to cause temperature of the arc spot of the cathode to be lowered. However, since the reduction of the arcing current to excess brings about unstable arcing, this method is incapable of preventing the surface of the thin film from being roughened when the low melting point material is used as the cathode material.

SUMMARY OF THE INVENTION

The present invention has been developed for solving the above-described problem, and an object of the present invention is to provide an arc evaporator, a method for driving the arc evaporator, and an ion plating apparatus that are capable of preventing a surface of a thin film from being roughened when forming the thin film using a low melting point material as a cathode material.

According to the present invention, there is provided an arc evaporator comprising: an anode; an evaporation source electrode as a cathode; and a current control unit for supplying an AC square wave arcing current across the anode and the evaporation source electrode.

With this constitution, by suitably changing the square waveform of the arcing current, the average value of the arcing current can be reduced while maintaining the arcing. Therefore, the temperature of the arc spot can be lowered. As a result, the particle size of the evaporated particles can be made smaller and the surface of the thin film formed on the substrate can be thereby prevented from being roughened. In addition, since the average value of the arcing current can be reduced, the ion plating can be conducted at low temperature.

In this case, the AC square wave arcing current may have a positive value period shorter than a negative value period in a cycle. Thereby, the average value of the arcing current can be effectively reduced.

Also in this case, a frequency of the AC square wave arcing current may be 400 Hz or more. Thereby, since an absolute period during which the arcing current has a negative value is shortened, the arcing can be sustained even if the ratio of the positive value period to the negative value period of the arcing current can be reduced to reduce the average current.

Also, a frequency of the AC square wave arcing current may be between 1 kHz and 10 kHz. Thereby, since the absolute period during which the arcing current has a negative value can be further shortened, the arcing can be suitably sustained.

In the arc evaporator, the current control unit may be capable of controlling at least one of a frequency of the AC square wave arcing current, a ratio of the positive value period to the negative value period in the cycle, and a ratio an absolute value of a positive value to an absolute value of a negative value in the cycle. Thereby, the square waveform of the arcing current can be changed so as to prevent the surface of the thin film formed on the substrate from being roughened.

The arc evaporator may further comprise: a particle-size sensor for detecting a particle size of evaporated particles made of a cathode material evaporated from the evaporation source electrode, and the current control unit is adapted to control an average value of the arcing current based on the particle size detected by the particle-size sensor. Thereby, the arcing current can be controlled to allow the evaporated particles to have a desired particle size.

In this case, the particle-size sensor may comprise: a pair of electrodes placed opposite to each other, between which a DC electric field is formed; a particle collector for capturing the evaporated particles passing through a space between the pair of electrodes and thereby deflected by a predetermined amount; and a current detecting circuit for detecting a value for a current caused by the evaporated particles captured by the particle collector. Thereby, the constitution of the particle-size sensor for the evaporated particles can be simplified.

Also, the particle-size sensor may comprise: a light emitting unit for emitting light toward a portion of a surface of a substrate on which the evaporated particles are attached and formed into a thin film; a light receiving unit for detecting intensity of the light emitted from the light emitting unit and reflected on the surface of the substrate; and a control circuit for detecting a ratio of intensity of the light emitted from the light emitting unit to the intensity of the light detected by the light receiving unit. Thereby, the constitution of the particle-size sensor for the evaporated particles can be simplified.

According to the present invention, there is also provided a method for driving an arc evaporator which has an anode, an evaporation source electrode as a cathode, and a current control unit for supplying an AC square wave arcing current across the anode and the evaporation source electrode, the method comprising: controlling at least one of a frequency of the arcing current, a ratio of a positive value period to a negative value period in a cycle, and a ratio of an absolute value of a positive value to an absolute value of a negative value in the cycle. Thereby, the arcing current can be controlled to allow the evaporated particles to have a desired particle size.

In this case, the frequency of the arcing current may be controlled. Thereby, since the absolute period during which the arcing current has the negative value changes according to the frequency, the arcing current can be sustained by suitably setting the frequency.

In the method for driving the arc evaporator, the ratio of the positive value period to the negative value period in the cycle of the arcing current may be controlled. Thereby, since the average value of the arcing current changes according to the ratio of the positive value period to the negative value period, the average value of the arcing current, and hence, the particle size of the evaporated particles can be changed by changing the ratio of the positive value period to the negative value period. In addition, since the evaporation rate of the evaporated particles changes according to the ratio of the positive value period to the negative value period, it can be changed by changing the ratio of the positive value period to the negative value period.

Also, in the method for driving the arc evaporator, the ratio of the absolute value of the positive value to the absolute value of the negative value in the cycle of the arcing current may be controlled. Thereby, since the average value of the arcing current changes according to the ratio of the absolute value of the positive value to the absolute value of the negative value, the average value of the arcing current, and hence, the particle size of the evaporated particles can be changed by changing the ratio of the absolute value of the positive value to the absolute value of the negative value.

According to the present invention, there is provided an ion plating apparatus comprising: a vacuum chamber; a substrate holder provided in the vacuum chamber for holding a substrate; and an arc evaporator that uses an AC square wave arcing current to evaporate a cathode material in the vacuum chamber. With this constitution, the surface of the thin film formed on the substrate can be prevented from being roughened. Further, since the average value of the arcing current can be reduced, the ion plating can be carried out at low temperature.

According to the present invention, there is further provided an ion plating apparatus capable of performing ion plating and plasma chemical vapor deposition (CVD) in one chamber. With this constitution, since the chamber is evacuated once to conduct both of the ion plating and the plasma CVD, the production cost can be reduced.

In this case, the ion plating apparatus may comprise: a chamber having an exhaust port and a material gas supply port through which a material gas is supplied; an exhaust pump for exhausting the chamber through the exhaust port; a substrate holder provided in the chamber for holding a substrate; an arc evaporator for evaporating a cathode material in the chamber; means for opening/closing the material gas supply port; an openable cover that covers a cathode material evaporation portion of the arc evaporator; and a radio frequency power supply for generating a plasma in the chamber. With this constitution, the cover of the cathode material evaporation portion of the arc evaporator is opened and the material gas supply port is closed to conduct the ion plating, while the cover of the cathode material evaporation portion is closed and the material gas supply port is opened to conduct the plasma CVD. In this way, the ion plating and the plasma CVD can be carried out in one chamber. In general, a surface of the substrate that is to be coated has a three-dimensional shape. In this ion plating apparatus, since there is no restriction in the operation attitudes of the arc evaporation sources, a required number of arc evaporation sources can be installed at positions optimized for film formation onto the substrate. As a result, the ion plating of the present invention can be conducted suitably as compared to the ion plating using an evaporation source using resistance heating.

Further, in this case, the arc evaporator may use an AC square wave arcing current to evaporate the cathode material. With this constitution, the surface of the thin film formed on the substrate can be prevented from being roughened.

According to the present invention, there is further provided an ion plating apparatus comprising: a vacuum chamber; a substrate holder provided in the vacuum chamber for holding a substrate; an arc evaporator that uses an AC square wave arcing current to evaporate a cathode material in the vacuum chamber; and a radio frequency power supply for generating a plasma in the vacuum chamber. With this constitution, since the AC square wave arcing current is used in the evaporator even in the case where the ion plating is conducted by applying a radio frequency power in the vacuum chamber, the average current can be reduced to lower the temperature of the cathode material evaporation portion.

According to the present invention, there is still further provided an arc evaporator comprising: an anode; an evaporation source electrode as a cathode; a current control unit for supplying an arcing current across the anode and the evaporation source electrode; and a deflecting unit for deflecting evaporated particles made of a cathode material evaporated from the evaporation source electrode. With this constitution, since the substrate holder is placed on the course of the deflected evaporated particles and is not situated in front of the evaporation source electrode, the increase in the temperature of the substrate due to the radiant heat from the evaporation source electrode can be prevented.

In this case, the arc evaporator may further comprise means for rotating the deflecting unit. With this constitution, since a number of substrates can be ion-plated simultaneously and without being rotated by placing these substrates annularly forward of the evaporation source electrode.

According to the present invention, there is still further provided an arc evaporator comprising: an anode; an evaporation source electrode as a cathode; and a current control unit for supplying an arcing current across the anode and the evaporation source electrode, the arcing current having a waveform that rises substantially vertically with respect to a time axis and then falls gradually or in steps. Thereby, since the material to be evaporated is first heated rapidly by the steeply rising arcing current and then the arcing current immediately starts falling, the particle size of the evaporated particles can be prevented from becoming large-sized. As a result, the surface of the thin film formed on the substrate can be suitably prevented from being roughened.

In this case, the waveform of the arcing current may be a santooth wave. Thereby, the particle size of the evaporated particles can be suitably prevented from becoming large-sized, and thereby, the surface of the thin film made of the evaporated material can be suitably prevented from being roughened.

Also in this case, the waveform of the arcing current may be a repeated step wave. Thereby, the particle size of the evaporated particles can be suitably prevented from becoming large-sized and, thereby, the surface of the thin film made of the evaporated material can be suitably prevented from being roughened.

According to the present invention, there is still further provided an ion plating apparatus comprising: a vacuum chamber; a substrate holder provided in the vacuum chamber for holding a substrate; and an arc evaporator that uses an arcing current to evaporate a cathode material in the vacuum chamber, the arcing current having a waveform that rises substantially vertically with respect to a time axis and then falls gradually or in steps. Thereby, the surface of the thin film made of the evaporated material can be prevented from being roughened.

According to the present invention, there is still further provided an ion plating apparatus comprising: a vacuum chamber; a substrate holder provided in the vacuum chamber for holding a substrate; and an arc evaporator that uses an arcing current to evaporate a cathode material in the vacuum chamber, the arcing current having a waveform that rises substantially vertically with respect to a time axis and then falls gradually or in steps; and a radio frequency power supply for generating a plasma in the vacuum chamber. Thereby, the surface of the thin film made of the evaporated material can be prevented from being roughened.

The above and further objects and features of the invention will more fully be apparent from the following detailed description of the accompanying drawings

BRIEF DESCRIPTION OF THE DRAWINGS

FIG. 10 is a table showing waveforms of the arcing current of the arc evaporator according to the sixth embodiment of the present invention and reflectances of the thin films formed from the evaporated material.

DETAILED DESCRIPTION OF THE PREFERRED EMBODIMENTS

Hereinafter, preferred embodiments of the present invention will be described with reference to accompanying drawings.

First Embodiment

Figure 1:
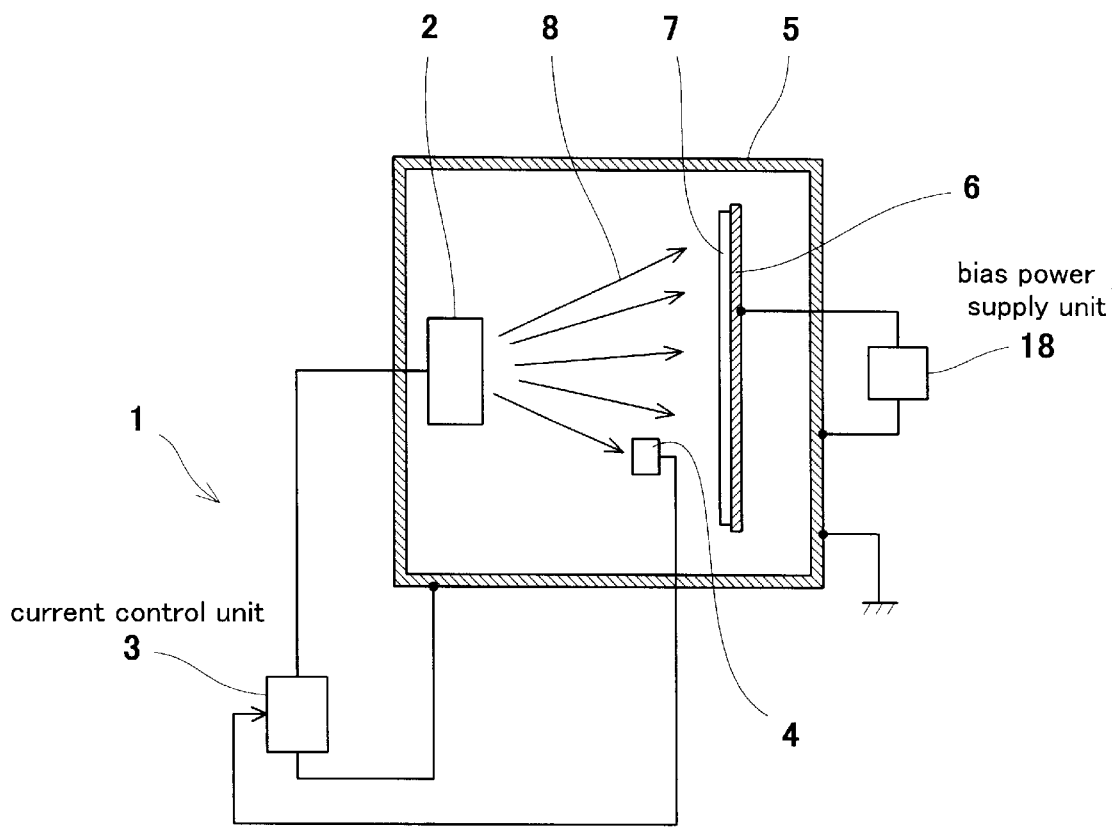
FIG. 1 is a cross-sectional view schematically showing a constitution of an arc evaporator and an ion plating apparatus according to a first embodiment of the present invention.
Figure 2:
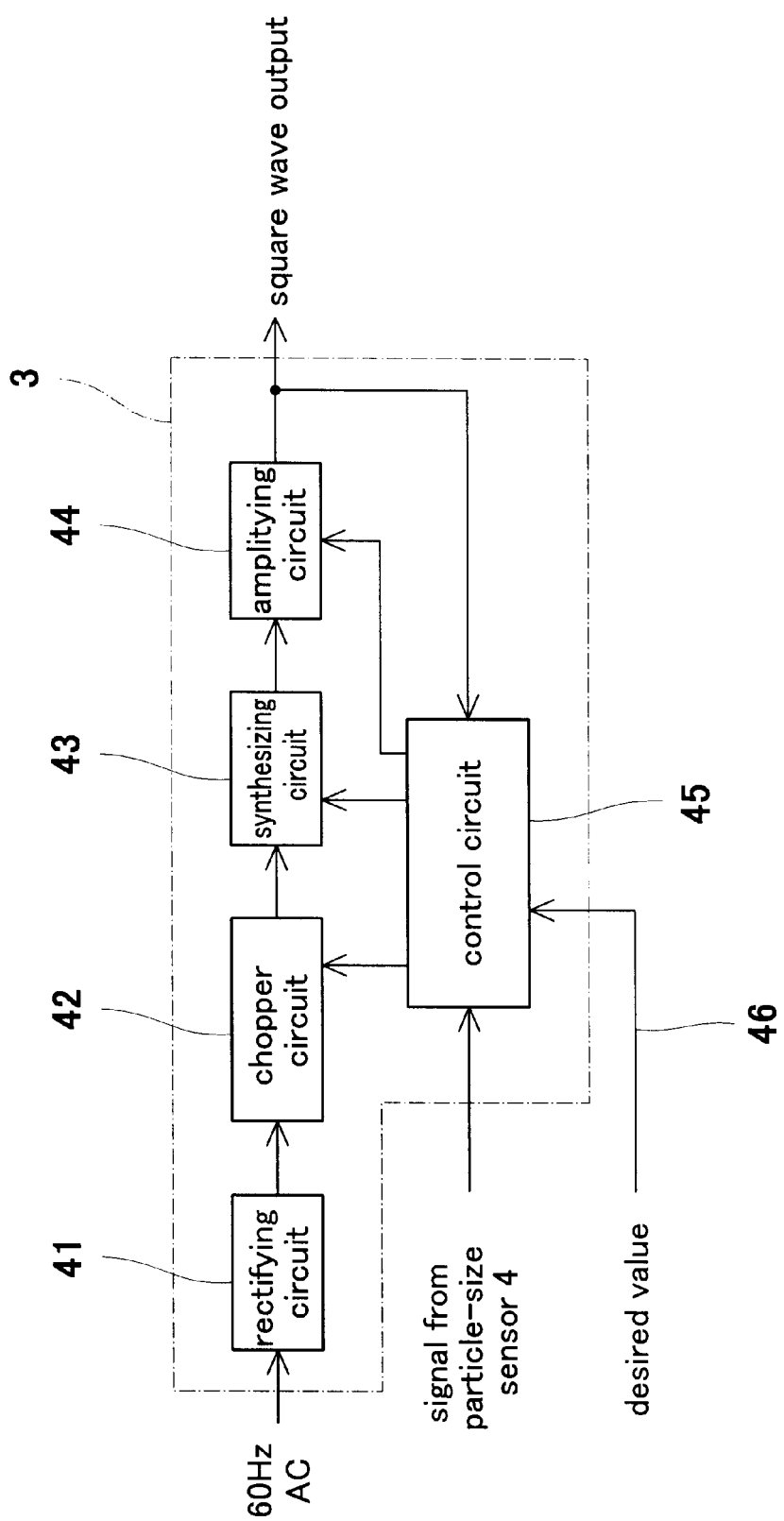
FIG. 2 is a block diagram schematically showing a constitution of a current control unit of the arc evaporator of FIG. 1.
Figure 3:
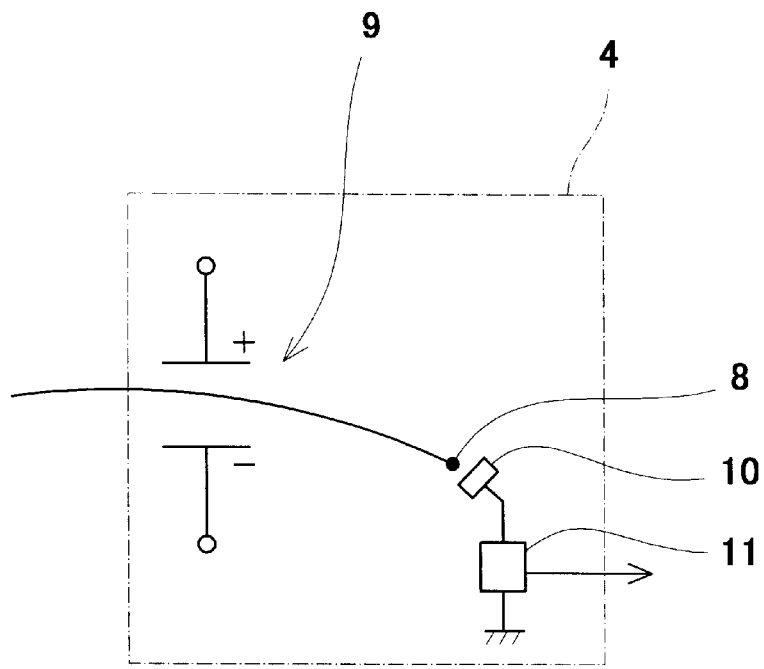
FIG. 3 is a view schematically showing a constitution of a particle-size sensor of the arc evaporator of FIG. 1.
Figure 4:
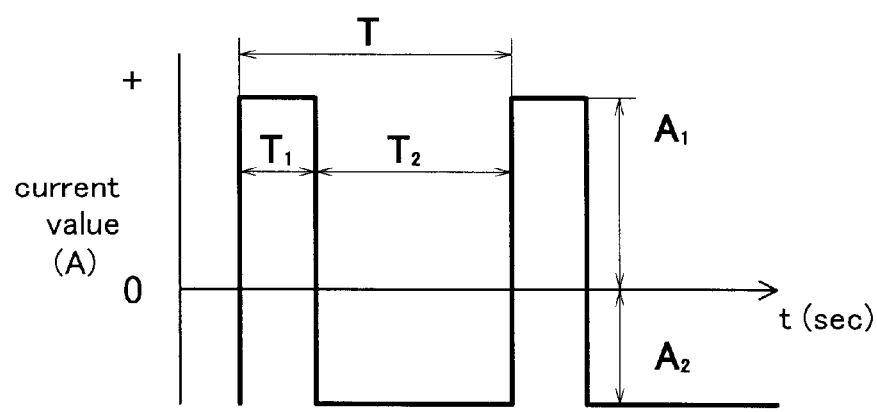
FIG. 4 is a graph showing a current waveform output from the current control unit of the arc evaporator of FIG. 1.

FIG. 1 is a cross-sectional view schematically showing a constitution of an arc evaporator and an ion plating apparatus according to a first embodiment of the present invention. FIG. 2 is a block diagram schematically showing a constitution of a current control unit of the arc evaporator of FIG. 1. FIG. 3 is a view schematically showing a constitution of a particle-size sensor of the arc evaporator of FIG. 1. FIG. 4 is a graph showing a current waveform output from the current control unit of the arc evaporator of FIG. 1.

Referring now to FIG. 1, an ion plating apparatus of this embodiment is provided with a substrate holder 6 for holding a substrate 7 in a vacuum chamber 5 and an evaporation source electrode 2 as a cathode such that it is placed opposite to the substrate holder 6. The ion plating apparatus is further provided with a particle-size sensor 4 forward of the substrate holder 6. The vacuum chamber 5 is constituted by a conductive member and electrically grounded. The current control unit 3 is adapted to apply an arcing voltage across the vacuum chamber 5 and the evaporation source electrode 2, and control an arcing current due to the arcing voltage. That is, the vacuum chamber 5 corresponds to an anode of the arc evaporation source, and the vacuum chamber 5 and the evaporation source electrode 2 constitute the arc evaporation source. A detection signal of the particle-size sensor 4 is input to the current control unit 3. The arc evaporation source, the current control unit 3, and the particle-size sensor 4 constitute an arc evaporator 1 of this embodiment. The substrate holder 6 is constituted by a conductive member, and a predetermined bias voltage is applied across the substrate holder 6 and the vacuum chamber 5 by a bias power supply unit 18. The bias voltage is applied such that the substrate holder 6 has a negative potential with respect to the vacuum chamber 5. Reference numeral 8 denotes evaporated particles made of a cathode material evaporated from the evaporation source electrode 2. Hereinafter, in the specification and claims, "evaporated particles made of the evaporated cathode material" refer to both of molecules of the evaporated cathode material and particles of a sputtered cathode material.

Referring to FIGS. 2, 4, the current control unit 3 comprises a rectifying circuit 41 that rectifies an AC (alternating current) current of a commercial frequency, a chopper circuit 42 that converts a DC (direct current) current output from the rectifying circuit 41 into a square wave pulse current, a synthesizing circuit 43 that synthesizes the square wave pulse current output from the chopper circuit 42 and the DC current to generate an AC square wave current, an amplifying circuit 44 that amplifies the AC square wave current output from the synthesizing circuit 43, and a control circuit 45 comprising CPU. The control circuit 45 receives desired values 46 externally input and compares the respective desired values 46 to an output of the amplifying circuit 44 and an input from the particle-size sensor 4, thereby performing feedback control of the chopper circuit 42, the synthesizing circuit 43, and the amplifying circuit 44. Thereby, the AC square wave current of FIG. 4 is output from the amplifying circuit 41. In FIG. 4, the current flowing from the vacuum chamber 5 toward the evaporation source electrode 2 is set to +(plus).

The desired value 46 for a cycle T of the AC square wave current, the desired value 46 for a ratio of a positive value period T1 to a negative value period T2 in one cycle (hereinafter simply referred to as a ratio of the positive value period T1 to the negative value period T2), the desired value 46 for a ratio of an absolute value of a positive value A1 to an absolute value of a negative value A2 in one cycle (hereinafter simply referred to as a ratio of the positive value A1 to the negative value A2), the desired value 46 for an amplitude (A1+A2), and the desired value 46 for a particle size of the evaporated particles 8, are externally input. The control circuit 45 controls the chopper circuit 42 to thereby control the cycle T of the AC square wave current and the ratio of the positive value period T1 to the negative value period T2. The control circuit 45 also controls the synthesizing circuit 43 to thereby control the ratio of the positive value A1 to the negative value A2 of the AC square wave current. The control circuit 45 further controls the amplifying circuit 44 to thereby control the amplitude (A1+A2) of the AC square wave current. The control circuit 45 still further controls the ratio of the positive value period T1 to the negative value period T2 of the AC square wave current or the ratio of the positive value A1 to the negative value A2 of the AC square wave current to thereby control the particle size of the evaporated particles 8.

Referring to FIG. 3, the particle-size sensor 4 has a pair of electrodes 9 placed opposite to each other. A DC voltage is applied from a DC power supply (not shown) to the pair of electrodes 9, and a DC electric field is therefore formed between the pair of electrodes 9. The particle-size sensor 4 is provided with a particle collector 10 for acquiring the evaporated particles 8 passing through a space between the pair of electrodes 9 and thereby deflected by a predetermined amount. The particle-size sensor 4 is further provided with a current detecting circuit 11 for detecting a value for a current caused by the evaporated particles 8 captured by the particle collector 10. A signal indicating the value for the current is output from the current detecting circuit 11 as a signal indicating a particle size.

Subsequently, an operation of the ion plating apparatus so constituted will be explained.

Referring to FIGS. 1–4, the substrate 7 is mounted to the substrate holder 6, and then the ion plating apparatus is activated. The vacuum chamber 5 is evacuated by an exhaust pump (not shown) to a predetermined degree of vacuum and kept. Then, the bias power supply unit 18 is operated to apply a predetermined bias voltage to the substrate holder 6, causing the substrate holder 6 to be kept at a negative potential with respect to the vacuum chamber 5. Then, the current control unit 3 is operated to start arcing in the evaporation source electrode 2, to cause an AC square wave arcing current to flow across the evaporation source electrode 2. Thereby, the cathode material is evaporated from the evaporation source electrode 2 and produced into the evaporated particles 8, which are ionized by electrons traveling from the evaporation source electrode 2 toward the vacuum chamber 5 and attached onto the substrate 7. In this way, a thin film made of the cathode material is formed on a surface of the substrate 7.

During this operation, a part of the particles evaporated from the evaporation source electrode 2 are captured by the particle-size sensor 4. As shown in FIG. 3, since the evaporated and ionized particles pass through the space between the pair of electrodes 9 where the DC electric field is formed, the course of the traveling particles is deflected by the DC electric field. In this case, the smaller the particle size of the evaporated particles is, the higher the degree of the deflection is, and hence, the larger the current value output from the particle-size sensor 4 is. So, the particle size of the evaporated particles 8 can be detected by the particle-size sensor 4. Receiving a particle-size signal output from the particle-size sensor 4, the current control unit 3 reduces the ratio of the positive value period T1 to the negative value period T2 of the arcing current or the ratio of the positive value A1 to the negative value A2 of the arcing current when the particle size of the evaporated particles 8 is large. This reduces an average value of the arcing current and thereby lowers the temperature of the arc spot of the cathode of the evaporation source electrode 2. Therefore, the particle size of the evaporated particles 8 is made smaller. As a result, the surface of the thin film formed on the substrate 7 can be prevented from being roughened. Conversely, when the particle size of the evaporated particles 8 is small, the current control unit 3 increases the ratio of the positive value period T1 to the negative value period T2 of the arcing current or the ratio of the positive value A1 to the negative value A2 of the arcing current. This increases the average value of the arcing current and thereby raises the temperature of the arc spot of the cathode of the evaporation source electrode 2. Therefore, the particle size of the evaporated particles 8 is made larger. In actuality, however, since the particle size of the evaporated particles 8 is not smaller than the size of atoms and the particle size as the desired value is set to an atomic level, the current control unit 3 does not control the arcing current for the purpose of making the particle size of the evaporated particles large. Although any of the ratio of the positive value period T1 to the negative value period T2 of the arcing current and the ratio of the positive value A1 to the negative value A2 of the arcing current may be changed to cause the particle size of the evaporated particles 8 to be changed, it is preferable that the ratio of the positive value period T1 to the negative value period T2 is changed. This is because a certain instantaneous current value or larger is required to maintain the arcing, and when the ratio of the positive value period T1 to the negative value period T2 is changed, the average current value can be reduced while maintaining the certain instantaneous current value or larger. It should be remembered that the change in the ratio of the positive value period T1 to the negative value period T2 changes an evaporation rate as well as the particle size of the evaporated particles 8, while the change in the ratio of the positive value A1 to the negative value A2 changes only the particle size of the evaporated particles 8.

By changing the desired value 46 externally input, the waveform of the arcing current can be changed. By changing the cycle T, i.e., the frequency, the stability of the arcing can be changed. Specifically, the higher the frequency is, the higher the stability of the arcing is. So, the arcing might discontinue if the frequency is less than 400 Hz. It is therefore desirable to set the frequency to 400 Hz or more, and more desirable to set the frequency to several KHz-several tens KHz. Also, as described above, by changing the ratio of the positive value period T2 to the negative value period T1, the particle size and evaporation rate of the evaporated particles 8 can be changed, and by changing the ratio of the positive value A2 to the negative value A1, only the particle size of the evaporated particles 8 can be changed. Accordingly, by suitably set these ratios according to a melting point of the cathode material, the surface of the thin film formed on the substrate 7 can be prevented from being roughened. As a result, even if the low melting point material such as aluminum is used as the cathode material, the thin film can be formed on the substrate 7 without a roughened surface, which has been conventionally unfulfilled.

Figure 5:
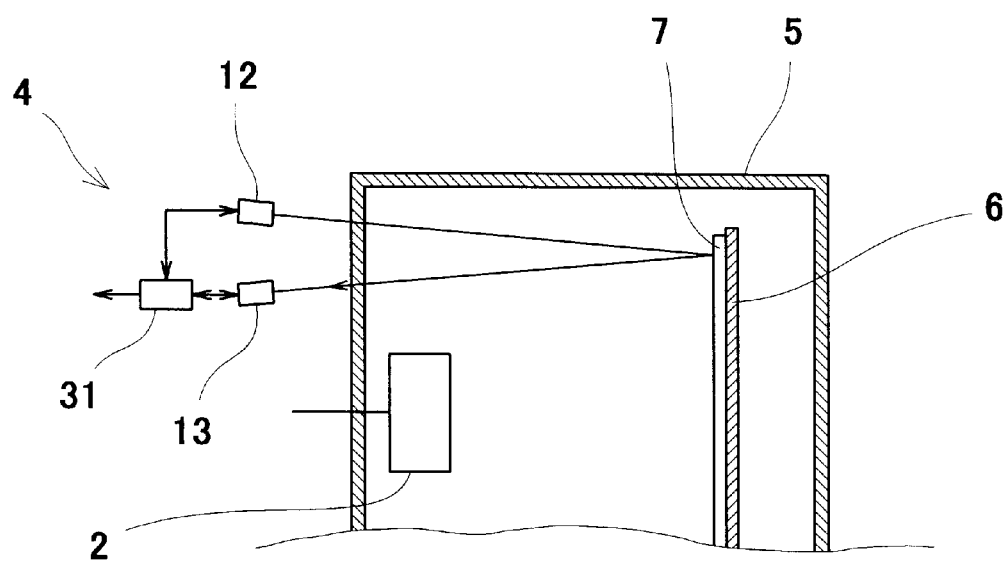
FIG. 5 is a cross-sectional view schematically showing another constitution of the particle-size sensor.

Subsequently, a modification of this embodiment will be explained. FIG. 5 is a cross-sectional view schematically showing another constitution of the particle-size sensor. As shown in FIG. 5, a particle-size sensor 4 comprises a light emitting unit 12 that emits light toward a portion of the surface of the substrate 7 on which the evaporated particles 8 are attached and formed into the thin film, a light receiving unit 13 that detects intensity of the light emitted from the light emitting unit 12 and reflected on the surface of the substrate 7, and a control circuit 31 that detects a ratio of intensity of the light emitted from the light emitting unit 12 to the intensity of the light detected by the light receiving unit 13. A glass window (not shown) is provided in a portion of a wall portion of the vacuum chamber 5, through which the light passes. For example, a light emitting diode can be employed as the light emitting unit 12, and a photo diode can be employed as the light receiving unit 13.

With this constitution, since the reflectance of the light of the substrate 7 changes according to the particle size of the evaporated particles, and according to this change, the ratio of the light intensity detected by the control circuit 31 changes, the particle size of the evaporated particles can be detected in a simplified manner.

Second Embodiment

A second embodiment of the present invention illustrates an ion plating apparatus capable of performing ion plating and plasma CVD (chemical vapor deposition) in a chamber.

Figure 6:
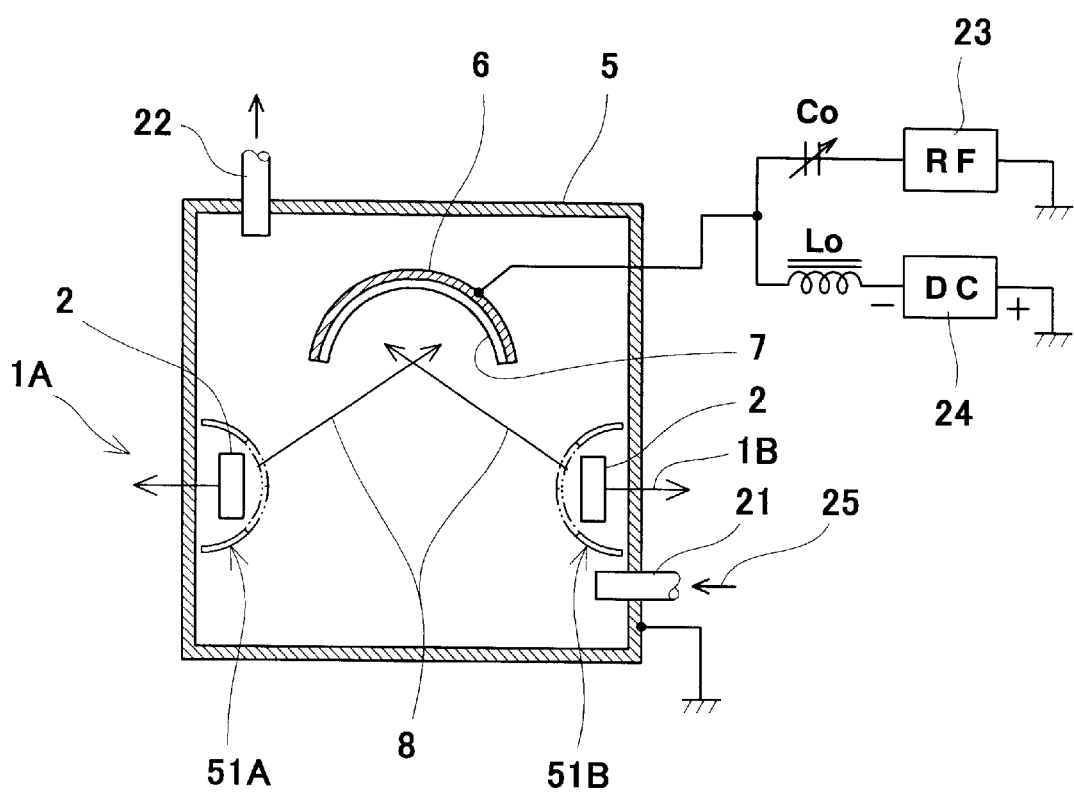
FIG. 6 is a cross-sectional view schematically showing a constitution of an ion plating apparatus according to a second embodiment of the present invention.

FIG. 6 is a cross-sectional view schematically showing a constitution of the ion plating apparatus of this embodiment. In FIG. 6, the same reference numerals as those in FIG. 1 denotes the same or the corresponding parts.

As shown in FIG. 6, the ion plating apparatus of this embodiment comprises a chamber 5 having an exhaust port 22 and a material gas supply port 21 through which a material gas 25 is supplied, an exhaust pump (not shown) that exhausts the chamber 5 through the exhaust port 22, a substrate holder 6 provided in the chamber 5 for holding the substrate 7, arc evaporators (only evaporation source electrode 2 is shown in FIG. 6) 1A, 1B that evaporate the cathode material in the chamber 5, means for opening/closing the material gas supply port 21 (not shown), openable covers 51A, 51B that cover the evaporation source electrodes 2 of the arc evaporators 1A, 1B, a radio frequency power supply 23 that generates a plasma in the chamber 5, and a DC power supply 24 that applies a bias voltage to the substrate holder 6.

In this embodiment, the substrate 7 is a head lamp or the like of automobile and is hemispherical as shown in FIG. 6. The substrate 7 is structured such that a metal layer and a rustproof resin layer are provided on a glass substrate. The evaporation source electrodes 2 are provided on side walls of the chamber 5 below the substrate 7 to allow the cathode material to be attached onto an inner surface of the hemispherical substrate 7.

Reference numeral CO denotes a DC blocking capacitor and reference numeral L0 denotes an AC blocking choke coil.

Subsequently, an operation of the ion plating apparatus so constituted will be explained.

First of all, the covers 51A, 51B that cover the evaporation source electrodes 2 are opened to expose these electrodes as indicated by a solid line, and the material gas supply port 21 is closed. Also, the radio frequency power supply 23 is stopped and only the DC power supply 24 is operated. In this state, the arc evaporators 1A, 1B are operated to conduct ion plating. Thereby, a metal thin film made of the cathode material is formed on the substrate 7.

Then, the covers 51A, 51B are closed to cover the evaporation source electrodes 2 as indicated by an alternate long and two short dashes line and the material gas supply port 21 is opened. Thereby, the material gas 25 comprising resin monomer is filled in the chamber 25. Then, in this filled state, the radio frequency power supply 23 and the DC power supply 24 are operated to conduct the plasma CVD. Thereby, the plasma is generated in the chamber 5 and causes a resin monomer to be polymerized to be formed into a resin thin film on the metal thin film of the substrate 7. In this way, an head lamp with the metal layer and the rustproof resin layer provided on the substrate 7 is obtained.

Since the ion plating and the plasma CVD can be conducted in one chamber, the chamber is evacuated once, which results in a reduced production cost. In addition, since there is no restriction in the operation attitudes of the evaporation source electrodes 2, the electrodes 2 are placed at positions optimized for film formation onto the substrate 7. Consequently, the ion plating can be suitably conducted even for the hemispherical substrate 7.

Third Embodiment

Figure 7:
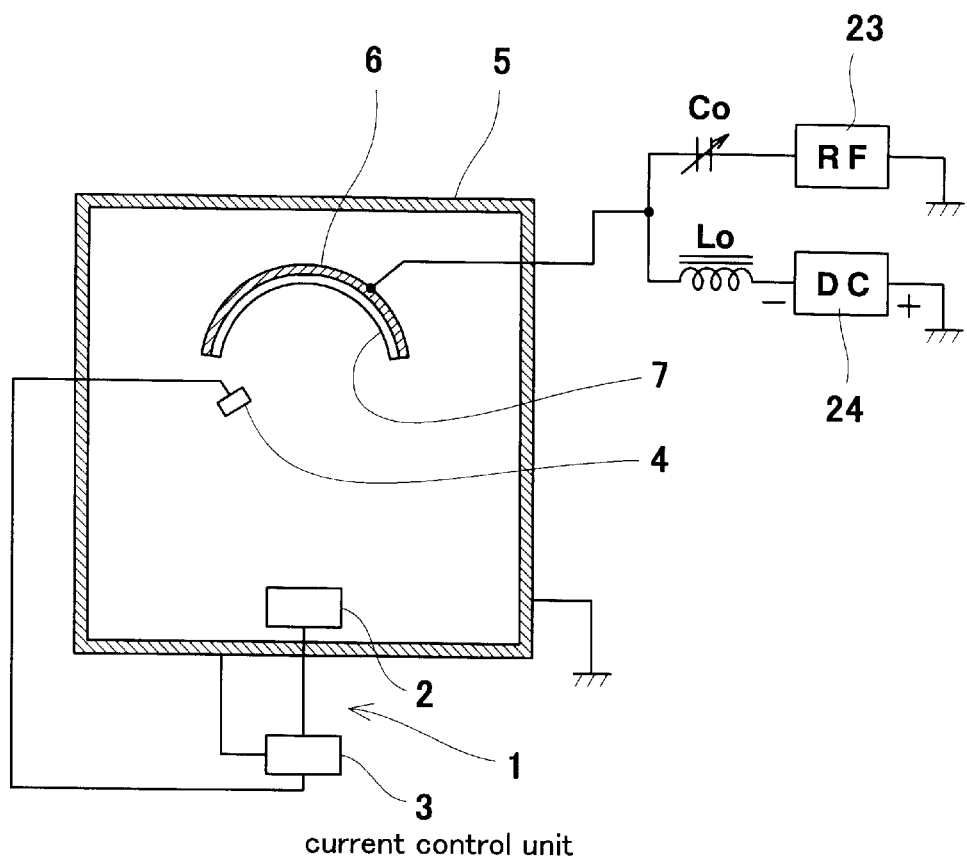
FIG. 7 is a cross-sectional view schematically showing a constitution of an ion plating apparatus according to a third embodiment of the present invention.

FIG. 7 is a cross-sectional view schematically showing a constitution of an ion plating apparatus according to a third embodiment of the present invention. In FIG. 7, the same reference numerals as those in FIGS. 1, 6 denote the same or corresponding parts.

As shown in FIG. 7, the ion plating apparatus of this embodiment uses the arc evaporator 1 of the first embodiment. This embodiment is identical to the first embodiment except that a radio frequency voltage by the radio frequency power supply 23 as well as a DC bias voltage by a DC power supply 24 is applied across the substrate 6 and the vacuum chamber 5.

In the ion plating apparatus so constituted, when the apparatus is activated, the radio frequency power supply 23 generates the plasma in the vacuum chamber 5 and the DC power supply 24 forms a DC electric field from the vacuum chamber 5 to the substrate holder. Then, the particles are evaporated from the evaporation source electrodes 2. The evaporated particles are excited by the plasma and accelerated by the DC electric field. The accelerated particles collide with the substrate 7 and are formed into a dense thin film made of the cathode material thereon.

Since the arc evaporator 1 uses the AC square wave arcing current, the average current can be reduced to cause the temperature of the evaporation source electrodes 2 to be lowered. Therefore, the increase in the temperature of the substrate 7 can be suppressed and the ion plating can be therefore carried out at low temperature. This effect can be obtained likewise in the second and third embodiments.

Fourth Embodiment

Figure 8:
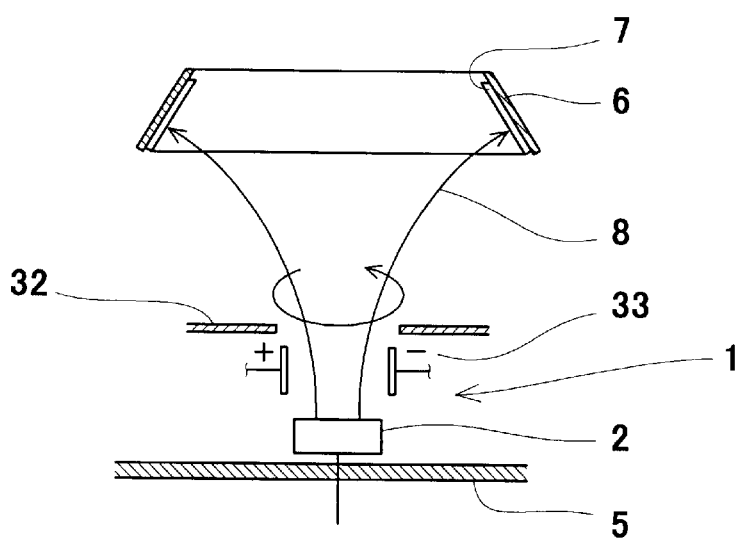
FIG. 8 is a cross-sectional view showing a constitution of an arc evaporator according to a fourth embodiment of the present invention.

FIG. 8 is a cross-sectional view schematically showing a constitution of an arc evaporator according to a fourth embodiment of the present invention. In FIG. 8, the same reference numerals as those in FIG. 1 denote the same or corresponding parts.

Referring to FIG. 8, an arc evaporator 1 of this embodiment comprises a deflecting unit 33 that deflects the particles 8 evaporated from the evaporation source electrode 2 and means for rotating the deflecting unit 33 (not shown) in addition to the constitution of the first embodiment.

In this embodiment, the deflecting unit 33 is constituted by a pair of electrodes provided above the evaporation source electrode 2 and connected to a DC power supply (not shown). A screen plate 32 opened in a portion situated above the evaporation source electrode 2 is provided above the deflecting unit 33.

A truncated-cone shaped substrate holder 6 having an opening in a central portion thereof is placed above the shield plate 32 and a number of substrates 7 are mounted to an inner surface of the substrate holder 6.

With this constitution, the particles 8 evaporated from the evaporation source electrode 2 are deflected by the pair of electrodes of the deflecting unit 33 and attached onto the substrate 7 of the substrate holder 6. Specifically, the substrate holder 6 is situated on the course of the deflected evaporated particles 8 and is not situated right above the evaporation source electrode 2. For this reason, the increase in the temperature of the substrate 7 due to radiant heat from the evaporation source electrode 2 can be prevented. In addition, since the deflecting unit 33 is rotated, a number of substrates 7 can be ion-plated simultaneously and without being rotated by annularly placing these substrates 7 above the evaporation source electrode 2 as shown in FIG. 8.

Fifth Embodiment

In the fifth embodiment of the present invention, two different cathode materials are set in the respective evaporation source electrodes 2 of the arc evaporators 1A, 1B in the ion plating apparatus according to the second embodiment of FIG. 6 and switching between the arc evaporators 1A, 1B is performed during ion plating. With this constitution, a thin film comprising layers made of two different materials can be formed in the same vacuum chamber.

When three or more arc evaporators are used, a thin film comprising layers made of three or more cathode materials can be formed in the same manner. The same effect can be obtained by providing a plurality of evaporation source electrodes in one arc evaporator. Further, also in the ion plating apparatuses of the first and seventh embodiments, the different cathode materials can be set in the plurality of evaporation source electrodes, and switching among these electrodes can be performed during ion plating.

Sixth Embodiment

A sixth embodiment of the present invention illustrates waveforms of an arcing current other than the AC square wave, allowing the surface of the thin film made of the evaporated material to be prevented from being roughened.

Figure 9:
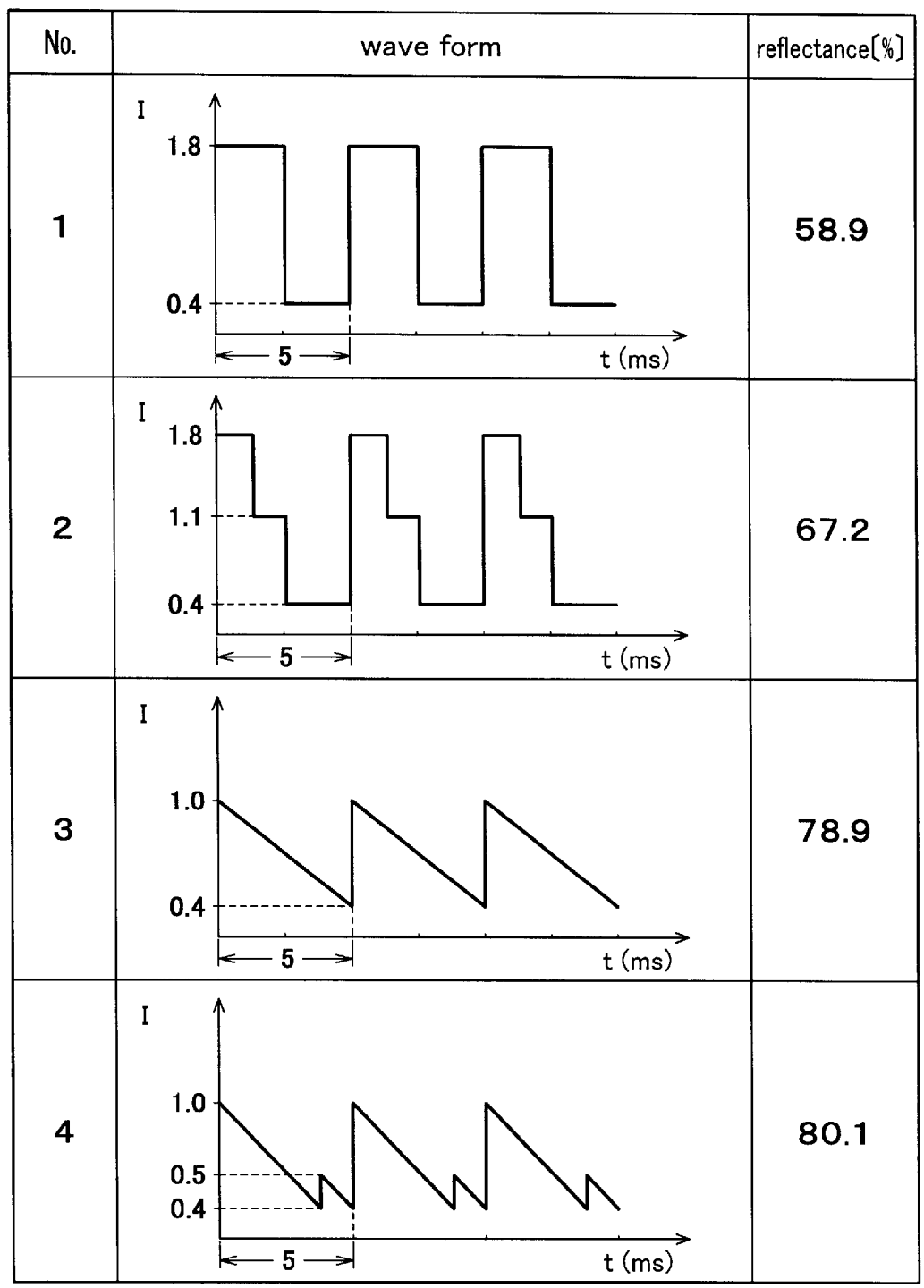
FIG. 9 is a table showing waveforms of an arcing current of an arc evaporator according to a sixth embodiment of the present invention and reflectances of thin films formed from an evaporated material.
Figure 10:
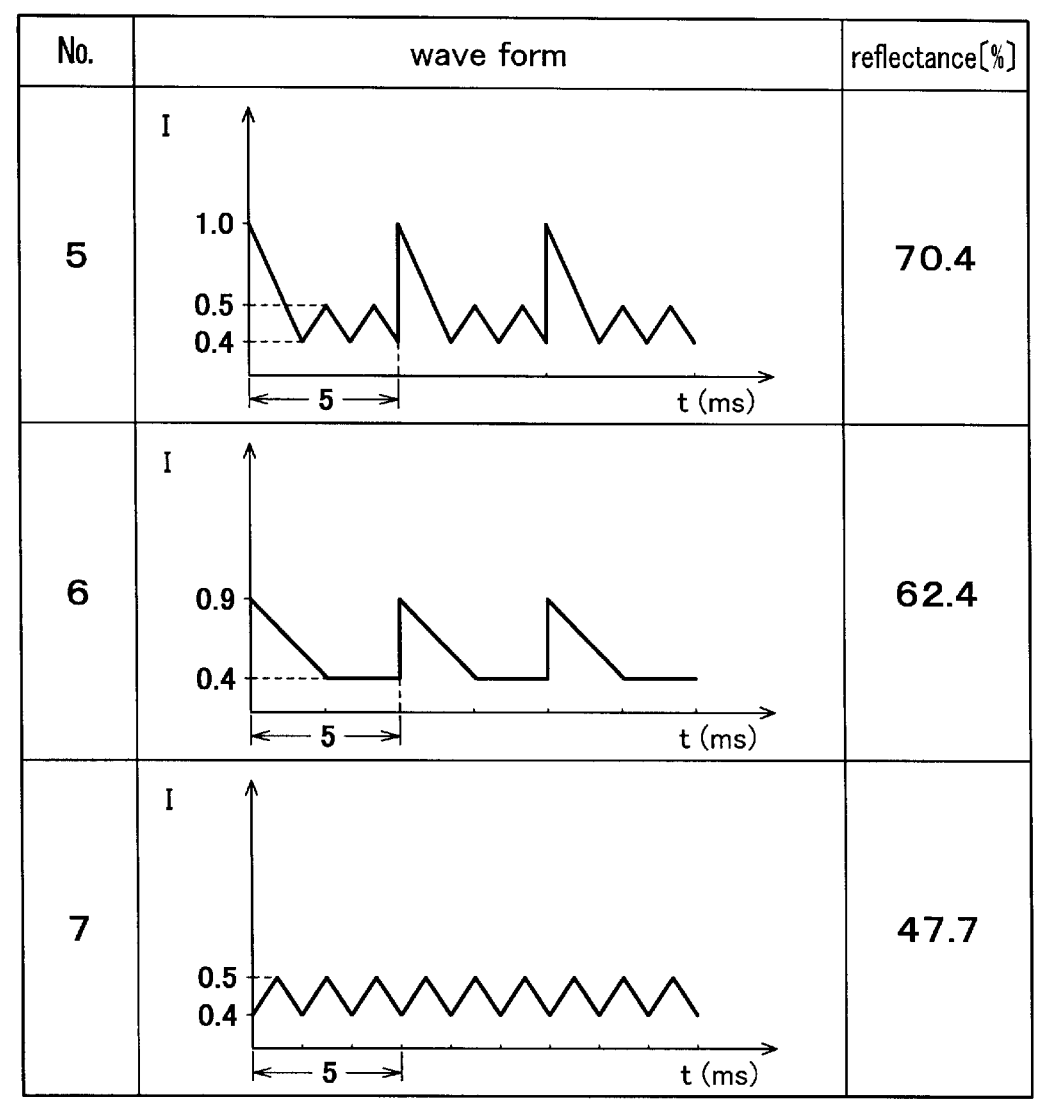

FIGS. 9, 10 are tables illustrating waveforms of the arcing current of the arc evaporator of this embodiment and reflectances of thin films made of the evaporated materials.

The entire constitutions of the arc evaporator and the ion plating apparatus of this embodiment are almost the same as those of the third embodiment (FIG. 7). The difference is that the current control unit of this embodiment is adapted to supply an arcing current having a waveform that first rises substantially vertically with respect to a time axis and then falls gradually or in steps. In addition, the current control unit of this embodiment is adapted not to perform the feedback control of the arcing current using the particle-size sensor.

Referring to FIGS. 9, 10, in this embodiment, a repeated step wave (No. 2), a santooth wave (No. 3), and modified santooth waves (No. 4-No. 6) are adopted as the waveform that first rises substantially vertically with respect to the time axis and then falls gradually or in steps. These waveforms are compared to the DC square wave (No. 1) and a waveform (No. 7) rising gradually with respect to the time axis. This comparison is made on the basis of the reflectances of the thin films made of the evaporated materials. In the case of respective waveforms, the thin films are produced at a DC bias voltage of 200V, for 3 minutes, and at a pressure of $(5.0 \times 10^{-3})$ Torr in the vacuum chamber. Since generating circuits of the respective waveforms are well known, description thereof is omitted.

In this embodiment, as can be seen from FIGS. 9, 10, the reflectance in the case of the DC square wave (No. 1) was 58.9%, while the reflectances in the case of the repeated step wave (No. 2) and the santooth wave (No. 3) were respectively 67.2% and 78.9%, which were significantly greater than the reflectance in the case of the DC square wave (No. 1). The santooth wave (No. 4) having large and small peaks brought about the most preferable reflectance, which was 80.1%. The waveform of the arcing current that first rises substantially vertically with respect to the time axis and then falls gradually or in steps is satisfactory for improvement of the reflectances. With regard to triangular waveforms, not to mention the basic santooth wave (No. 3) and the santooth wave (No. 4) having the two peaks, both of which have continuous triangular waveforms, the waveform (No. 6) having triangular waveforms apart from one another and the waveform (No. 5) in which a gently rising triangular waveform is present between steeply rising triangular waveforms respectively brought about improved reflectances, which were respectively 62.4% and 70.4%.

On the other hand, the gently rising triangular waveform (No. 7) as the compared wave brought about the reflectance of 47.7% lower than that of the DC square wave.

As described above, this embodiment used the arcing current having the waveform that first rises substantially vertically with respect to the time axis and then falls gradually or in steps, and as a result, the reflectances of the thin films made of the evaporated materials were thereby made higher than the reflectance of the DC square wave. This might be due to the fact that the particle size of the evaporated particles can be prevented from becoming large-sized and consequently, the surface of the thin film made of the evaporated material can be prevented from being roughened, because the arcing current steeply rises to rapidly heat the material to be evaporated in the arc spot and immediately starts falling.

While the waveform that first rises substantially vertically with respect to the time axis and then falls gradually or in steps has been described as the waveform of the arcing current, the waveform may fall gradually, for example, in curves or in zigzags, or it may be AC waveform.

While the arc evaporator of this embodiment is used in the ion plating apparatus using the radio frequency plasma of the third embodiment, this evaporator can be used in the ion plating using only the DC bias of the first embodiment or another vapor deposition.

While in the second and fourth embodiments, the arc evaporation source uses the AC square wave arcing current, a normal DC arcing current or the arcing current that first rises substantially vertically with respect to the time axis and then falls gradually or in steps, which is illustrated in the sixth embodiment, may be used.

Numerous modifications and alternative embodiments of the invention will be apparent to those skilled in the art in view of the foregoing description. Accordingly, the description is to be construed as illustrative only, and is provided for the purpose of teaching those killed in the art the best mode of carrying out the invention. The details of the structure and/or function maybe varied substantially without departing from the spirit of the invention and all modifications which come within the scope of the appended claims are reserved.

What is claimed is:

1. An arc evaporator comprising:
    an anode;
    an evaporation source electrode as a cathode; and
    a current control unit for supplying an AC square wave arcing current across the anode and the evaporation source electrode.

2. The arc evaporator according to claim 1, wherein the AC square wave arcing current has a positive value period shorter than a negative value period in a cycle.

3. The arc evaporator according to claim 1, wherein a frequency of the AC square wave arcing current is 400 Hz or more.

4. The arc evaporator according to claim 1, wherein a frequency of the AC square wave arcing current is between 10 kHz and 10 kHz.

5. The arc evaporator according to claim 1, wherein the current control unit is capable of controlling at least one of a frequency of the AC square wave arcing current, a ratio of a positive value period to a negative value period in the AC square wave arcing current cycle, and a ratio of an absolute value of a positive value to an absolute value of a negative value in the AC square wave arcing current cycle.

6. The arc evaporator according to claim 1, further comprising:
    a particle-size sensor for detecting a particle size of evaporated particles made of a cathode material evaporated from the evaporation source electrode, and wherein
    the current control unit is adapted to control an average value of the arcing current based on the particle size detected by the particle-size sensor.

7. The arc evaporator according to claim 6, wherein the particle-size sensor comprises:
    a pair of electrodes placed opposite to each other, between which a DC electric field is formed;
    a particle collector for capturing the evaporated particles passing through a space between the pair of electrodes and thereby deflected by a predetermined amount; and
    a current detecting circuit for detecting a value for a current caused by the evaporated particles captured by the particle collector.

8. The arc evaporator according to claim 6, wherein the particle-size sensor comprises:
    a light emitting unit for emitting light toward a portion of a surface of a substrate on which the evaporated particles are attached and formed into a thin film;
    a light receiving unit for detecting intensity of the light emitted from the light emitting unit and reflected on the surface of the substrate; and
    a control circuit for detecting a ratio of intensity of the light emitted from the light emitting unit to the intensity of the light detected by the light receiving unit.

9. A method for driving an arc evaporator which has an anode, an evaporation source electrode as a cathode, and a current control unit for supplying an AC square wave arcing current across the anode and the evaporation source electrode, the method comprising controlling:
    at least one of a frequency of the arcing current, a ratio of a positive value period to a negative value period in a cycle, and a ratio of an absolute value of a positive value to an absolute value of a negative value in the cycle.

10. The method for driving the arc evaporator according to claim 9, wherein the frequency of the arcing current is controlled.

11. The method for driving the arc evaporator according to claim 9, wherein the ratio of the positive value period to the negative value period in the cycle of the arcing current is controlled.

12. The method for driving the arc evaporator according to claim 9, wherein the ratio of the absolute value of the positive value to the absolute value of the negative value in the cycle of the arcing current is controlled.

13. An ion plating apparatus comprising:

a vacuum chamber;

a substrate holder provided in the vacuum chamber for holding a substrate; and an arc evaporator that uses an AC square wave arcing current to evaporate a cathode material in the vacuum chamber.

14. An ion plating apparatus comprising:

a vacuum chamber;

a substrate holder provided in the vacuum chamber for holding a substrate; and an arc evaporator that uses an arcing current to evaporate a cathode material in the vacuum chamber, the arcing current having a waveform that rises substantially vertically with respect to a time axis and then falls gradually or in steps; and a radio frequency power supply for generating a plasma in the vacuum chamber.

15. The ion plating apparatus capable of performing ion plating and plasma chemical vapor deposition in one chamber comprising:

a chamber having an exhaust port and a material gas supply port through which a material gas is supplied;

an exhaust pump for exhausting the chamber through the exhaust port;

a substrate holder provided in the chamber for holding a substrate;

an arc evaporator for evaporating a cathode material in the chamber;

means for opening/closing the material gas supply port;

and openable cover that covers a cathode material evaporation portion of the arc evaporator; and a radio frequency power supply for generating a plasma in the chamber.

16. The ion plating apparatus according to claim 15, wherein the arc evaporator uses an AC square wave arcing current to evaporate the cathode material.

17. An ion plating apparatus comprising:

a vacuum chamber;

a substrate holder provided in the vacuum chamber for holding a substrate;

an arc evaporator that uses an AC square wave arcing current to evaporate a cathode material in the vacuum chamber; and a radio frequency power supply for generating a plasma in the vacuum chamber.

18. An arc evaporator comprising:

an anode;

an evaporation source electrode as a cathode;

a current control unit for supplying an arcing current across the anode and the evaporation source electrode;

a deflecting unit for deflecting evaporated particles made of a cathode material evaporated from the evaporation source electrode; and means for rotating the deflecting unit.

19. An ion plating apparatus comprising:

a vacuum chamber;

a substrate holder provided in the vacuum chamber for holding a substrate; and an arc evaporator that uses an arcing current to evaporate a cathode material in the vacuum chamber, the arcing current having a waveform that rises substantially vertically with respect to a time axis and then falls gradually or in steps.

20. An arc evaporator comprising:

an anode;

an evaporation source electrode as a cathode; and a current control unit for supplying an arcing current across the anode and the evaporation source electrode, the arcing current having a waveform that rises substantially vertically with respect to a time axis and then falls gradually or in steps.

21. The arc evaporator according to claim 20, wherein the waveform of the arcing current is a santooth wave.

22. The arc evaporator according to claim 20, wherein the waveform of the arcing current is a repeated step wave.

* * * * *

UNITED STATES PATENT AND TRADEMARK OFFICE
CERTIFICATE OF CORRECTION

PATENT NO. : 6,579,428 B2
DATED : June 17, 2003
INVENTOR(S) : Shirou Takigawa et al.

It is certified that error appears in the above-identified patent and that said Letters Patent is hereby corrected as shown below:

<u>Column 14,</u>
Line 6, please change "between 10kHz and 10 kHz" to -- between 1kHz and 10kHz --.

Signed and Sealed this

Sixteenth Day of September, 2003

JAMES E. ROGAN
*Director of the United States Patent and Trademark Office*